United States Patent [19]

Hübel

[11] Patent Number: 4,652,734

[45] Date of Patent: Mar. 24, 1987

[54] METHOD OF AND DEVICE FOR FEEDING INFORMATION ABOUT ARTICLES TO BE PROCESSED IN GALVANIZING INSTALLATIONS

[75] Inventor: Egon Hübel, Feucht, Fed. Rep. of Germany

[73] Assignee: Schering Aktiengesellschaft, Berlin, Fed. Rep. of Germany

[21] Appl. No.: 545,589

[22] Filed: Oct. 26, 1983

Related U.S. Application Data

[63] Continuation of Ser. No. 285,137, Jul. 20, 1981, abandoned.

[30] Foreign Application Priority Data

Jul. 19, 1980 [DE] Fed. Rep. of Germany ....... 3027410

[51] Int. Cl.⁴ .............................................. G06K 7/10
[52] U.S. Cl. .................................... 235/472; 235/492
[58] Field of Search .............. 235/492, 472, 375, 376; 250/555; 174/68.5

[56] References Cited

U.S. PATENT DOCUMENTS

| | | | |
|---|---|---|---|
| 2,502,785 | 4/1950 | Gottschal | 235/492 |
| 2,709,001 | 5/1955 | Stahl | 235/492 |
| 3,692,237 | 9/1972 | Fiderer | 250/555 X |
| 3,963,901 | 6/1976 | Gejas | 235/472 |
| 4,080,512 | 3/1978 | Ramet | 174/68.5 |
| 4,095,095 | 6/1978 | Muraoka | 235/375 |
| 4,166,574 | 9/1979 | Yokoyama | 235/375 |
| 4,180,204 | 12/1979 | Koenig | 235/472 |
| 4,309,600 | 1/1982 | Perry | 235/375 |
| 4,326,329 | 4/1982 | Ohsawa | 174/68.5 |
| 4,374,451 | 2/1983 | Miller | 235/375 |

FOREIGN PATENT DOCUMENTS 225250 7/1958 Australia .............. 235/376

*Primary Examiner*—Harold I. Pitts
*Attorney, Agent, or Firm*—Michael J. Striker

[57] ABSTRACT

A method of feeding information into data processing means of an automatic galvanizing installation about articles to be treated, includes the fixing of the information onto each article before the article is supplied to the installation. In the charging station of the installation, the applied information is read by a hand-operated, commercially available data reader.

1 Claim, 2 Drawing Figures

METHOD OF AND DEVICE FOR FEEDING INFORMATION ABOUT ARTICLES TO BE PROCESSED IN GALVANIZING INSTALLATIONS

This application is a continuation of application Ser. No. 285,137, filed July 20, 1981, now abandoned.

BACKGROUND OF THE INVENTION

The present invention relates in general to charging stations of automatic galvanizing installations, and in particular it relates to a method of and a device for feeding data about articles to be galvanized in such installations.

It is known that a galvanizing process differs widely according to the kind of articles to be treated. It is therefore necessary both in charging, and also in discharging, stations of such installations, through which the articles pass prior to their treatment in the galvanizing bath, to determine the kind of the supplied articles and accordingly what kind of treatment is required, that is, what kind of bath is necessary or how long the articles should be exposed to the bath, and the like. For instance, in the case of flat articles, the upper surface or the front side should be treated intermittently or continuously, and the same treatment should be applied to the rear side. Also, the amount of applied current, the exposure period, as well as current densities for respective baths differ from each other, and so differ the time intervals in the case of an intermittent treatment. All these data must be timely fed to the galvanizing installation before it starts processing the particular sort of articles.

In prior-art methods for feeding such information by means of punched cards, input keyboards, magnetic cards or by feeding data stored in a storing device, various shortcomings have been encountered. In particular, the disadvantage of such prior-art methods is the fact that in the event of an incorrect input by the operator or by assigning an incorrect punched card to the supplied articles, the automatic galvanizing installation has treated the articles in a correspondingly incorrect manner and damaged the latter, frequently to such an extent that the articles became unusable. Moreover, the manual feeding of information is relatively time-consuming and incompatible with automatically operating devices. Furthermore, the manual data feeding limits the amount of the applied information. In the case when punched cards are supplied simultaneously with the articles, they are exposed to the danger of being lost or made unusable.

SUMMARY OF THE INVENTION

It is therefore a general object of the present invention to overcome the aforementioned disadvantages.

More particularly, it is an object of the invention to provide an improved method of feeding data about the processed articles which is not possessed of these disadvantages.

An additional object of the invention is to provide such an improved method which simplifies the data feeding operation and thus makes it less expensive.

A further object of the invention is to provide such an improved method which ensures a reliable correlation between each article and the assigned information.

In keeping with these objects and others which will become apparent hereafter, one feature of the invention resides, in a method of feeding information about articles to be processed in automatically operating galvanizing installations having charging stations, in the steps of fixing corresponding information on each article before its entry into the installation, and thereupon feeding the article into the charging station and reading the fixed data in the station.

In this manner, it is ensured that the articles are always correlated with correct information. The articles can be of an arbitrary configuration. In the preferred embodiment, the articles are in the form of printed circuits whereby the information is applied on the printed circuits either in conventional letters or in the form of a code. As will be explained in more detail below, the application of data on each article is relatively simple and requires negligible costs. Also, the reading of the data is simple and is made preferably by means of a commercially available reading apparatus. In contrast to prior-art devices wherein any functional improvement is accompanied by a correspondingly increased manufacturing cost, the invention makes it possible in a surprising manner to achieve an absolutely reliable correlation between each article and the corresponding information necessary for proper functioning of the galvanizing installation, with a relatively minute additional cost in the manufacture of the articles. In the preferred embodiment, the data are printed on the board simultaneously with the circuit or are permanently applied on the board by drilling or punching. An additional advantage of the method of this invention is the resulting improved readability of the data, even in the case of an increased volume of information. For example, each article can be provided with additional data which do not pertain directly to a galvanizing process, such as for example operational data, data relating to operational life, and the like. This feature cannot be attained in practice in conventional methods of this type. An additional advantage of the method of this invention is in the fact that the data reading is carried out automatically without the necessity of a special knowledge on the part of the operator. It is sufficient that the operator at the charging station guides the reading device (letter reader, type code reader, and the like) over the corresponding area on the article. The rest of the data reading is performed automatically by the electronic data processing means connected to the data reader.

The data are fixed on each article either removably, for example by means of sticking onto the article an adhesion strip provided with the information. It may also be permanently fixed on the article as mentioned before by printing, stamping, milling, engraving, boring or impressing and the like.

The device for reading the data is preferably a commercially available hand-held electronic reading device connected to data processing means in the charging station.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
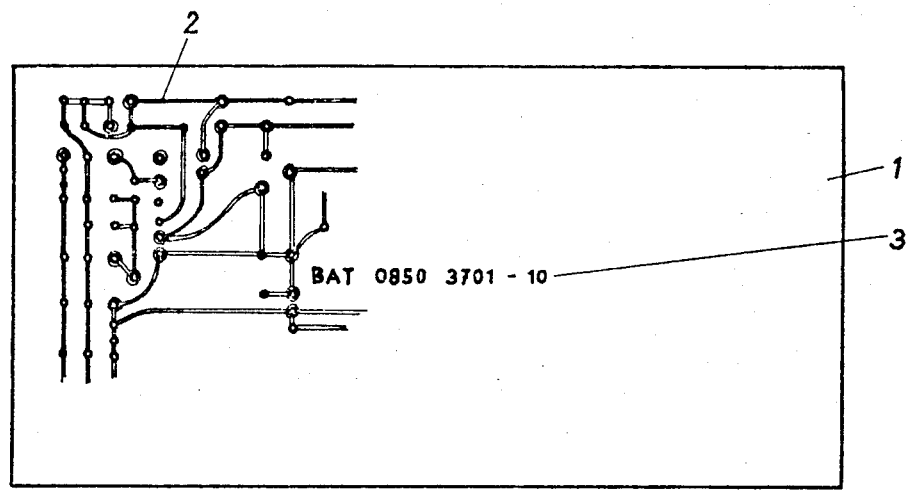
FIG. 1 is a top view of an article applicable for the method of this invention.

FIG. 1 shows a printed circuit board 1 with a printed pattern of conductors 2. A surface area of the board 1 which is insulated from the printed pattern 2 is provided with printed information 3. The printing of this data 3 which determines the mode of operation in a galvanizing installation for processing the boards 1, is made in the same manner as of circuits 2. The advantage of this arrangement is the fact that data 3 pertaining to the subsequent galvanizing process can be printed simultaneously with coded information pertaining to the printing of circuits 2, and consequently any possibility of placing data relating to the galvanization, to an incorrect printed circuit is thus eliminated. Moreover, the information for selecting the galvanization process is fixed on the printed circuit board in a single manufacturing step together with the printed circuit 2 without recognizably affecting manufacturing cost.

Figure 2:
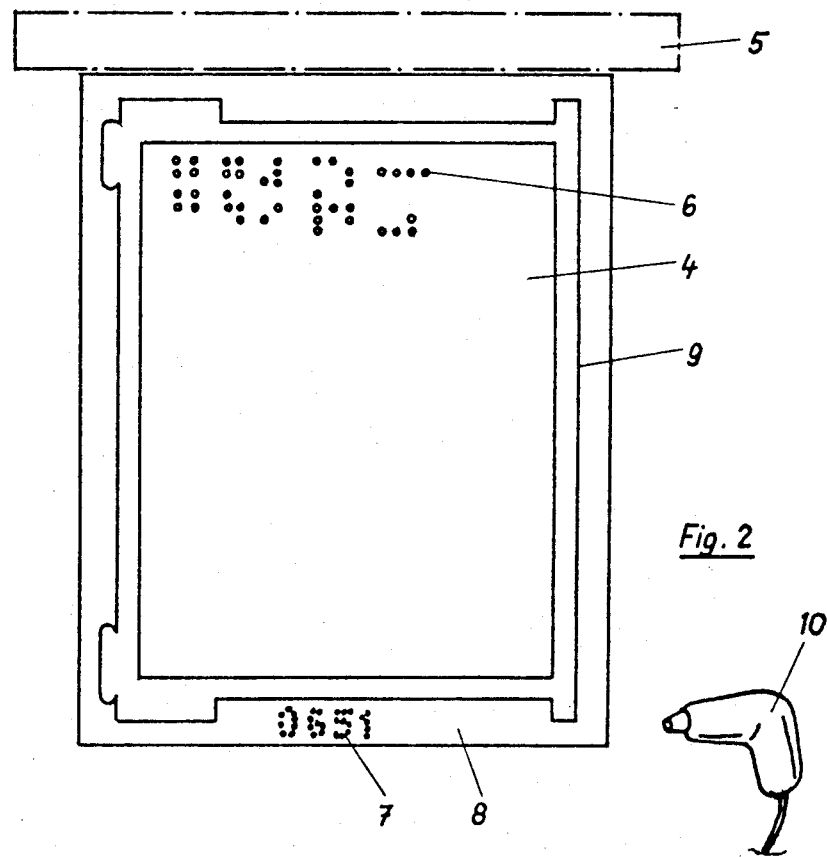
FIG. 2 is a top view of another article in connection with the device for reading data.

FIG. 2 shows an example of a circuit board 4 formed with an outer rim 8 which is suspended on a carrier 5 indicated schematically by dash-and-dot lines. By means of the carrier 5 the article is transported from a charging station into a selected bath of the galvanizing installation. The board 4 is formed with a pattern of perforations 6 into which a conductive substance is to be applied by a chemical process. This conductive substance on both sides of the board 4 represents contact points of the printed circuit which, in a subsequent operation, is applied on the board 4 by a printing process. The particular pattern of perforations 6 is manufactured also according to a coded information 7 in the form of perforated digits which have been previously formed in the rim area 8 of the article. The information 7 contains also data for carrying out the galvanizing process, and in this manner the same advantages are attained as described in the preceding example. Upon completing the galvanizing operation, the outer rim 8 is severed from the finished printed circuit board 4 along the inner edge 9.

The reading of the printed information 3 or of the perforated information 7 is accomplished by a suitable hand-held data reader or scanner 10 of any suitable, commercially available type which feeds the scanned data into a non-illustrated data processing device of the galvanizing installation, which in turn directs the advance of the article into a corresponding bath and also controls automatically the whole galvanizing process.

It will be understood that each of the elements described above, or two or more together, may also find a useful application in other types of articles differing from the types described above. For example, the perforated information 7 in the example of FIG. 2 can be replaced by a printed information similar to that of FIG. 1, or can be substituted by a strip-like code.

As mentioned above, any suitable mechanical shaping or working process such as stamping, milling, engraving, and the like, can be used for applying the data on the articles. In a modification, the information may be first formed on a carrier which is additionally fixed to the articles. The advantage of the first-mentioned mode of application is the fact that the data cannot be accidentally lost.

While the invention has been illustrated and described as embodied in articles to be processed in a galvanizing bath, it is not intended to be limited to the details shown, since various modifications and structural changes may be made without departing in any way from the spirit of this invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of galvanizing printed circuit boards in an automatically operating galvanizing installation including a charging station, comprising the steps of printing on each board a circuit simultaneously with a coded information pertaining to a subsequent galvanizing treatment, then feeding the boards into said charging station and reading the information therein, and then galvanizing each printed circuit board in accordance with the read-out information.

* * * * *